US011864425B2

(12) United States Patent
Baek et al.

(10) Patent No.: US 11,864,425 B2
(45) Date of Patent: Jan. 2, 2024

(54) ELECTROLUMINESCENT DISPLAY DEVICE HAVING LARGE SIZE AND HIGH DEFINITION

(71) Applicant: LG Display Co., Ltd., Seoul (KR)

(72) Inventors: Heume-Il Baek, Paju-si (KR); Ho-Jin Ryu, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/539,747

(22) Filed: Aug. 13, 2019

(65) Prior Publication Data

US 2020/0176531 A1 Jun. 4, 2020

(30) Foreign Application Priority Data

Nov. 29, 2018 (KR) .................. 10-2018-0150545

(51) Int. Cl.
*H10K 59/35* (2023.01)
*H10K 59/122* (2023.01)
(Continued)

(52) U.S. Cl.
CPC ........... *H10K 59/122* (2023.02); *H10K 59/35* (2023.02); *H10K 59/88* (2023.02); *G09G 3/32* (2013.01); *H10K 59/1201* (2023.02)

(58) Field of Classification Search
CPC ............. H01L 27/3246; H01L 27/3211; H01L 27/3218; H01L 27/326; H01L 27/3216;
(Continued)

(56) References Cited

U.S. PATENT DOCUMENTS

2003/0160915 A1* 8/2003 Liu .................... G02F 1/133514
349/106
2004/0174389 A1* 9/2004 Ben-David ............. G09G 5/02
345/694
(Continued)

FOREIGN PATENT DOCUMENTS

CN 103325315 A 9/2013
CN 103345887 B * 6/2016
(Continued)

OTHER PUBLICATIONS

CN 103345887 Machine Translation (Year: 2016).*
TW201419525 Machine English Translation (Year: 2014).*

*Primary Examiner* — David Chen
(74) *Attorney, Agent, or Firm* — Birch, Stewart, Kolasch & Birch, LLP

(57) ABSTRACT

An electroluminescent display device includes a plurality of sub-pixels arranged on a substrate along a first direction and a second direction crossing the first direction, and a light-emitting diode disposed in each of the plurality of sub-pixels and including a first electrode, a light-emitting layer and a second electrode, wherein among the plurality of sub-pixels, the sub-pixel of an nth row and an mth column has a same color as the sub-pixel of an (n+1)th row and an (m−1)th column, where n is a natural number and m is a natural number large than 4, and wherein among the plurality of sub-pixels, the sub-pixel of the nth row and a kth column has a same color as the sub-pixel of the nth row and a (k−2)th column, where k is a natural number smaller than or equal to m.

22 Claims, 9 Drawing Sheets

(51) Int. Cl.
*H10K 59/88* (2023.01)
*G09G 3/32* (2016.01)
*H10K 59/12* (2023.01)

(58) Field of Classification Search
CPC .. H01L 27/3223; H10K 59/122; H10K 59/35; H10K 59/88; H10K 59/1201
USPC ............... 257/40, E51.024; 438/34; 349/108
See application file for complete search history.

(56) References Cited

U.S. PATENT DOCUMENTS

| | | | | |
|---|---|---|---|---|
| 2013/0027437 A1* | 1/2013 | Gu | ...................... | H01L 27/0207 345/690 |
| 2014/0125714 A1* | 5/2014 | Pyo | ...................... | G09G 3/3233 345/691 |
| 2014/0197396 A1 | 7/2014 | Madigan | | |
| 2016/0079323 A1* | 3/2016 | Choi | .................... | H01L 27/3246 257/40 |
| 2016/0284774 A1* | 9/2016 | Zhang | ................. | H01L 27/1218 |
| 2017/0039918 A1* | 2/2017 | Tsao | ...................... | G09G 3/2003 |
| 2017/0104040 A1* | 4/2017 | Huangfu | ............... | G09G 3/2003 |
| 2018/0190736 A1* | 7/2018 | Kim | ....................... | H01L 27/322 |
| 2019/0266941 A1* | 8/2019 | Pyo | ........................... | G06T 7/90 |

FOREIGN PATENT DOCUMENTS

| | | |
|---|---|---|
| CN | 107464831 A | 12/2017 |
| EP | 3 343 626 A1 | 7/2018 |
| JP | 2003-208979 A | 7/2003 |
| KR | 10-1067555 B1 | 9/2011 |
| KR | 10-2015-0007262 A | 1/2015 |
| KR | 10-2015-0053463 A | 5/2015 |
| KR | 10-2016-0032742 A | 3/2016 |
| TW | 201419525 A * | 5/2014 |

\* cited by examiner

ELECTROLUMINESCENT DISPLAY DEVICE HAVING LARGE SIZE AND HIGH DEFINITION

CROSS-REFERENCE TO RELATED APPLICATION

The present application claims priority from and the benefit under 35 U.S.C § 119(a) of Korean Patent Application No. 10-2018-0150545 filed in the Republic of Korea on Nov. 29, 2018, which is hereby incorporated by reference in its entirety into the present application.

BACKGROUND OF THE INVENTION

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared to a liquid crystal display device because it is self-luminous and also has advantages of a thin thickness, light weight and low power consumption since a backlight unit is not necessary.

In addition, the electroluminescent display device is driven by low voltages of direct current (DC) and has a fast response time. Further, the electroluminescent display device is strong against the external impacts and is used in a wide range of temperatures because its components are solids. Moreover, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask.

However, the evaporation process increases manufacturing costs due to preparation of the mask and has a problem in application to a large-sized and high-definition display device due to manufacturing variations, sagging, shadow effect of the mask, and the like.

SUMMARY OF THE INVENTION

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate; a plurality of sub-pixels arranged on the substrate along a first direction and a second direction; and a light-emitting diode disposed at each of the plurality of sub-pixels and including a first electrode, a light-emitting layer and a second electrode, wherein the sub-pixel of an nth row (n is a natural number) and an mth column (m is a natural number larger than 4) has a same color as the sub-pixel of an (n+1)th row and an (m−1)th column, and wherein the sub-pixel of the nth row and a kth column (k is a natural number smaller than or equal to m) has a same color as the sub-pixel of the nth row and a (k−2)th column.

In another aspect, an electroluminescent display device includes a substrate on which a display area and a non-display area are defined; and a plurality of sub-pixels arranged on the substrate along a first direction and a second direction, wherein the sub-pixel of an nth row (n is a natural number) and an mth column (m is a natural number larger than 4) has a same color as the sub-pixel of an (n+1)th row and am (m−1)th column, and wherein the sub-pixel of the nth row and a kth column (k is a natural number smaller than or equal to m) has a same color as the sub-pixel of the nth row and a (k−2)th column.

In another aspect, an electroluminescent display device includes a plurality of sub-pixels arranged on a substrate along a first direction and a second direction crossing the first direction, and a light-emitting diode disposed in each of the plurality of sub-pixels and including a first electrode, a light-emitting layer and a second electrode, wherein among the plurality of sub-pixels, the sub-pixel of an nth row and an mth column has a same color as the sub-pixel of an (n+1)th row and an (m−1)th column, where n is a natural number and m is a natural number large than 4, and wherein among the plurality of sub-pixels, the sub-pixel of the nth row and a kth column has a same color as the sub-pixel of the nth row and a (k−2)th column, where k is a natural number smaller than or equal to m.

In another aspect, an electroluminescent display device includes a substrate on which a display area and a non-display area are defined; and a plurality of sub-pixels disposed in the display area and the non-display area, wherein among the plurality of sub-pixels in at least one of the display area and the non-display area, the sub-pixel of an nth row and an mth column has a same color as the sub-pixel of an (n+1)th row and am (m−1)th column, where n is a natural number and m is a natural number large than 4, and wherein among the plurality of sub-pixels in at least one of the display area and the non-display area, the sub-pixel of the nth row and a kth column) has a same color as the sub-pixel of the nth row and a (k−2)th column, where k is a natural number smaller than or equal to m.

In another aspect, an electroluminescent display device includes a substrate in which a display area and a non-display area adjacent to the display area are provided; and a plurality of sub-pixels arranged in a grid configuration on the substrate, and including a connection area in which first-color sub-pixels among the plurality of sub-pixels are connected to each other in a diagonal direction; a first bank disposed on the substrate, and including an opening extending in a non-diagonal direction and corresponding to a portion of the plurality of sub-pixels; and a second bank covering a portion of the first bank, and including a first opening corresponding to the opening of the first bank and a second opening corresponding to the connection area of the first-color sub-pixels.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

First Embodiment

Figure 1:
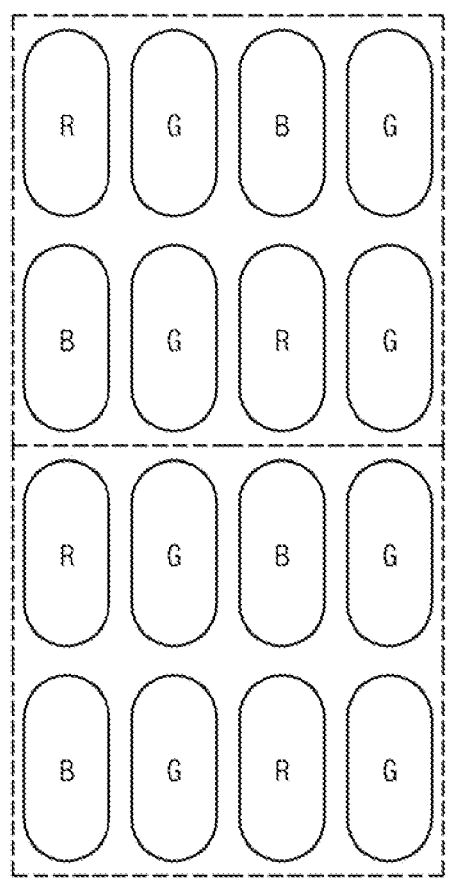
FIG. 1 is a schematic view of a pixel arrangement of an electroluminescent display device according to a first embodiment of the present disclosure.

FIG. 1 is a schematic view of a pixel arrangement of an electroluminescent display device according to a first embodiment of the present disclosure. All the components of the electroluminescent display device according to all embodiments of the present disclosure are operatively coupled and configured. For example, components known in the art to display images via a display area, e.g., drivers, power lines, data lines, signal lines, etc., are provided as operatively connected with a plurality of sub-pixels which will be discussed in more detail below according to various embodiments of the present disclosure.

In FIG. 1, the electroluminescent display device according to the first embodiment of the present disclosure includes red, green and blue sub-pixels R, G and B, and the red, green and blue sub-pixels R, G and B are arranged in a pentile form.

More specifically, in the electroluminescent display device according to the first embodiment of the present disclosure, the red and blue sub-pixels R and B are alternately arranged in the same column, and the green sub-pixels G are arranged in a column adjacent thereto. Here, the arrangement order of the red and blue sub-pixels R and B in one column is opposite to the arrangement order of the red and blue sub-pixels R and B in the next column.

Generally, red, green and blue sub-pixels of a general electroluminescent display device are arranged in stripes such that the same color sub-pixels are disposed in one column direction. However, the stripe arrangement has a problem in that the aperture ratio decreases as the resolution of the display device increases.

On the other hand, in the pentile arrangement, the number of red sub-pixels R and the number of blue sub-pixels B is half the number of green sub-pixels G. As a result, the number of all sub-pixels is reduced to $\frac{2}{3}$ in the pentile arrangement in comparison to the stripe arrangement, so that the high aperture ratio can be ensured and the effective resolution can be increased for the number of sub-pixels through the rendering driving.

Further, in the electroluminescent display device according to the first embodiment of the present disclosure, light-emitting layers of the red, green and blue sub-pixels R, G and B are formed through a solution process. Therefore, the manufacturing costs can be reduced by omitting a fine metal mask, and a display device with a large size and high definition can be implemented.

When each light-emitting layer is formed through the solution process, a solution is dropped into each of the plurality sub-pixels at a time, and to do this, different nozzles are used for the respective sub-pixels. However, a variation in the thickness of a thin film formed in each sub-pixel occurs due to a deviation in the dropping amounts of the nozzles. Accordingly, mura is generated along a scanning direction of the nozzles, and the image quality of the display device is lowered.

An electroluminescent display device according to a second embodiment of the present disclosure for preventing the image quality from being lowered by preventing the mura will be described in detail with reference to FIG. 2.

Second Embodiment

Figure 2:
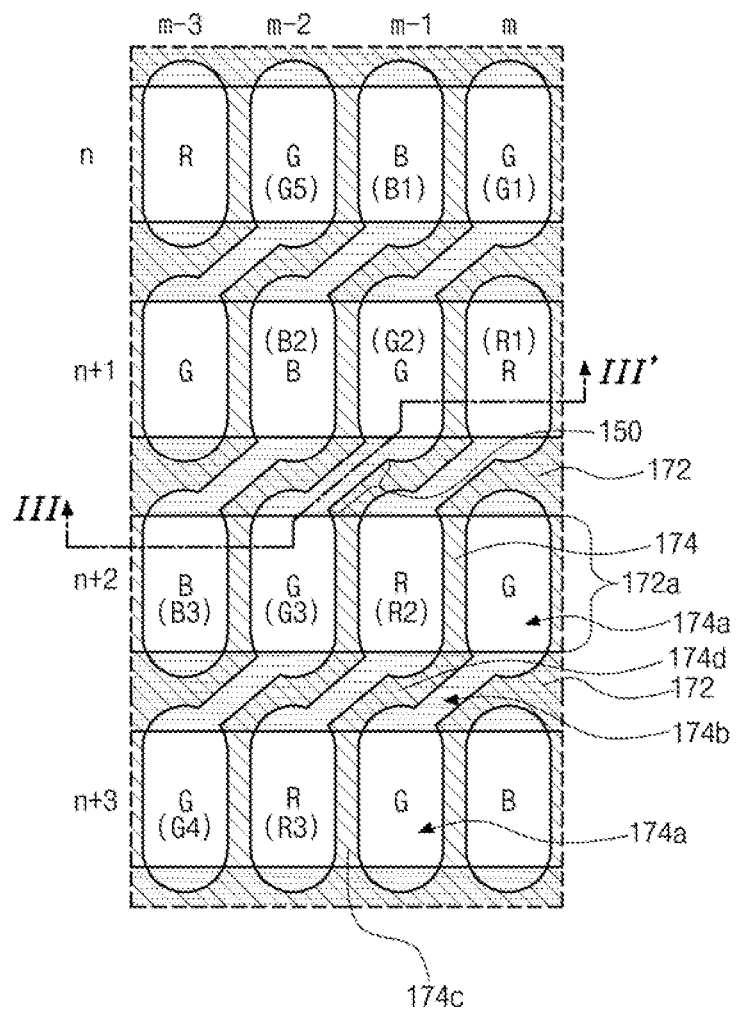
FIG. 2 is a schematic view of a pixel arrangement of an electroluminescent display device according to a second embodiment of the present disclosure.

FIG. 2 is a schematic view of a pixel arrangement of an electroluminescent display device according to a second embodiment of the present disclosure, where the pixel arrangement is provided in a display area of the display device.

In FIG. 2, the electroluminescent display device according to the second embodiment of the present disclosure includes red, green and blue sub-pixels R, G and B, and the same color sub-pixels R, G or B are arranged in a diagonal direction and connected to each other among the same color sub-pixels.

More specifically, the red, green and blue sub-pixels R, G and B include red, green and blue light-emitting layers, respectively, and the red, green and blue sub-pixels R, G and B are arranged in a matrix form. In this regard, the green sub-pixels G are arranged in a diagonal direction such that they form a diamond grid. The sub-pixel G in the nth row (n is a natural number) and the mth column (m is a natural number larger than 4), the sub-pixel G in the (n+1)th row and the (m−1)th column, the sub-pixel G in the (n+2)th row and the (m−2)th column, and the sub-pixel G in the (n+3)th row and the (m−3)th column have the same color, that is, green, and are disposed in a diagonal direction and are connected to each other at a connection area 150.

At this time, in the nth row and the (n+2)th row, the sub-pixel G of the mth column and the sub-pixel G of the (m−2)th column have the same color of green, and in the (n+1)th row and the (n+3)th row, the sub-pixel G of the (m−1)th column and the sub-pixel G of the (m−3)th column have the same color of green. All these green sub-pixels (e.g., G1, G2, G3 and G4) in adjacent rows and diagonally disposed are also connected to each other as shown, and the area in which two adjacent green sub-pixels (e.g., between G1 and G2, or between G2 and G3, or between G3 and Gr4) are diagonally connected is referred to herein as the connection area 150. All the green sub-pixels can have a plurality of the connection areas 150. As a result, in each row, the sub-pixel G of a kth column (k is a natural number smaller than or equal to m) has the same color of green as the sub-pixel G of the (k−2)th column. For example, in each row of sub-pixels, preferably only one non-green sub-pixel (e.g., R or B sub-pixel, and not two or more sub-pixels) exists between two adjacent green sub-pixels. In the example of FIG. 2, a blue sub-pixel B1 exists between two adjacent green sub-pixels G1 and G5.

In addition, the sub-pixel B in the (n−1)th row and the mth column, the sub-pixel B of the nth row and the (m−1)th column, the sub-pixel B in the (n+1)th row and the (m−2)th column, and the sub-pixel B in the (n+2)th row and the (m−3)th column have the same color, that is, blue, and are disposed in a diagonal direction and are connected to each other. For example, the blue sub-pixels B1, B2 and B3 in FIG. 2 are diagonally disposed and connected to each other and thus have diagonally-disposed connection areas similar to the connection areas 150. The sub-pixel R of the nth row and the (m+1)th column, the sub-pixel R in the (n+1)th row and the mth column, the sub-pixel R in the (n+2)th row and the (m−1)th column, and the sub-pixel R in the (n+3)th row and the (m−2)th column have the same color, that is, red, and are disposed in a diagonal direction and are connected to each other. For example, the red sub-pixels R1, R2 and R3 in FIG. 2 are diagonally disposed and connected to each other and thus have diagonally-disposed connection areas similar to the connection areas 150.

In the example of FIG. 2, it can be seen that there is only a single R or B sub-pixels between two adjacent green sub-pixels, both in column and row directions, where all the green sub-pixels form a diamond grid. For example, there is only blue sub-pixel B1 between the two adjacent green sub-pixels G1 and G5 extending in a row direction, and there is only one blue sub-pixel B2 between two adjacent green sub-pixels G5 and G3 extending in a column direction.

The arrangement of the red, green and blue sub-pixels R, G and B is not limited to the illustrated configuration. For example, if the rule according to the second embodiment is satisfied, the red sub-pixel R or the blue sub-pixel B (instead of the green sub-pixel G as shown in FIG. 2) can be disposed in the nth row and the mth column. In that case, the other color sub-pixels would be used to satisfy the arrangement rules discussed above and below.

Further, in the second embodiment of the present disclosure, the number of red sub-pixels R and the number of blue sub-pixels B is each half the number of green sub-pixels G, but is not limited thereto. Namely, the numbers of green and blue sub-pixels G and B each can be half the number of red sub-pixels R, or the numbers of red and green sub-pixels R and G each is half the number of blue sub-pixels B as occasion demands.

The pixel arrangement according to the second embodiment of the present disclosure can be implemented by using a bank structure.

More particularly, a bank according to the second embodiment of the present disclosure includes a first bank 172 (shaded portion) and a second bank 174 (different shaded portion).

The first bank 172 extends in a first direction (e.g., row direction) and is disposed between adjacent sub-pixels R, G and B in a second direction (e.g., column direction) perpendicular to the first direction. For example, the first bank 172 can be seen as strips extending in the row direction and includes a plurality of openings 172*a* between the strips.

The second bank 174 covers the entire pixel area shown in FIG. 2, but includes a first opening 174*a* and a second opening 174*b*. As such, the second bank 174 includes a first portion 174*c* disposed in an area between two adjacent sub-pixels extending a row direction, where the first portion 174*c* is disposed between two adjacent subpixels (e.g., B3 and G3, G3 and R2, etc.) (between the first openings 174*a*). The second bank 174 further includes a second portion 174*d* extending from the first portion 174*c* in the diagonal direction, where the second portion 174*d* is diagonally disposed between two diagonally disposed adjacent second openings 174*b*.

For example, the second bank 174 is disposed between adjacent sub-pixels R, G and B in the first direction and between adjacent sub-pixels R, G and B in the second direction. The first opening 174*a* corresponds to each sub-pixel R, G and B. For example, there is the first opening 174*a* between the sub-pixels B3 and G3, between the sub-pixels G2 and R1, etc. The second opening 174*b* is disposed between the adjacent sub-pixels R, G and B having the same color and connects the first openings 174*a* corresponding to the adjacent sub-pixels R, G and B having the same color. For example, there is the second opening 174*b* between the same color sub-pixels G2 and G3, between the sub-pixels R1 and R2, etc. The second openings 174*b* can be diagonally disposed. Therefore, the second bank 174*b* has the openings connected to each other along the diagonal direction crossing the first and second directions with respect to the same color sub-pixels R, G and B for each color, and each of the red, green and blue light-emitting layers is formed such that portions in the first and second openings 174*a* and 174*b* are connected to each other. The second bank 174 overlaps the first bank 172 at diagonally-disposed areas between the diagonally-disposed connection areas of the sub-pixels.

A cross-sectional structure of the electroluminescent display device according to the second embodiment of the present disclosure will be described with reference to FIG. 3.

Figure 3:
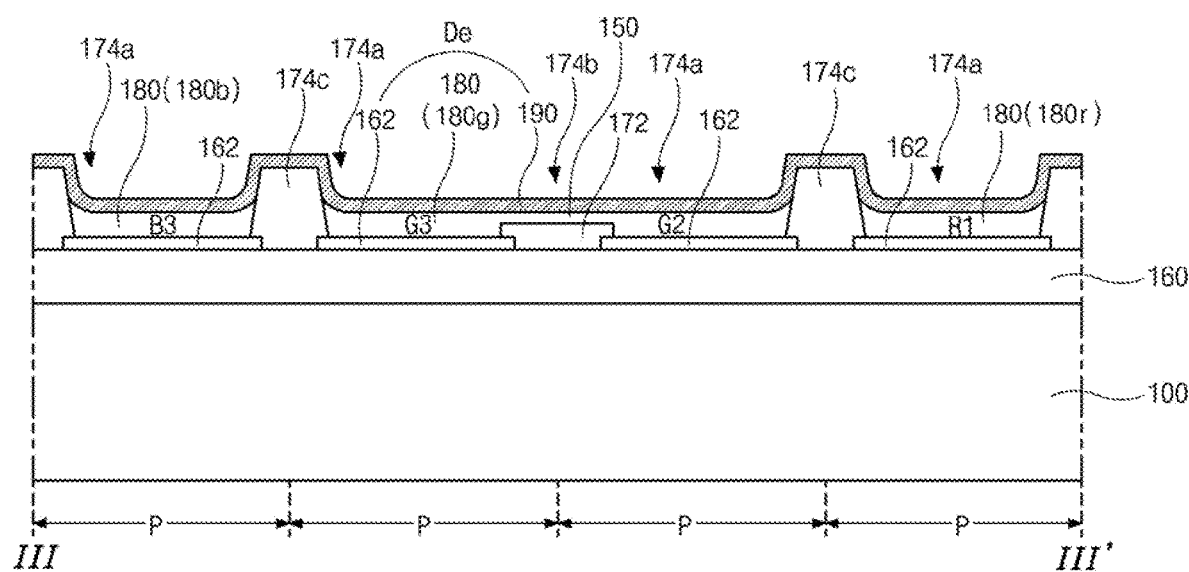
FIG. 3 is a schematic cross-sectional view of an electroluminescent display device according to the second embodiment of the present disclosure.

FIG. 3 is a schematic cross-sectional view of an electroluminescent display device according to the second embodiment of the present disclosure and shows a cross-section corresponding to the line III-III' of FIG. 2.

In FIG. 3, an overcoat layer 160 is formed on a substrate 100 on which a plurality of sub-pixel regions P are defined, and a first electrode 162 is formed at each of the sub-pixel regions P on the overcoat layer 160.

Further, one or more thin film transistors, capacitors and insulating layers can be further formed between the substrate 100 and the overcoat layer 160.

A first bank 172 and a second bank 174 are formed on the first electrode 162 and cover edges of the first electrode 162. The first bank 172 can be formed of a material having a hydrophilic property, for example, an inorganic insulating material such as silicon oxide ($SiO_2$) or silicon nitride (SiNx). Alternatively, the first bank 172 can be formed of polyimide. In addition, the second bank 174 can be formed of an organic insulating material having a hydrophobic property. Alternatively, the second bank 174 can be formed of an organic insulating material having a hydrophilic property and can be subjected to a hydrophobic treatment.

Here, the first bank 172 is formed between the same color sub-pixel regions P (e.g., between the green sub-pixels G3 and G2), and the second bank 174 is formed between different color sub-pixel regions P (e.g., between the blue and green subpixels B3 and G3). The first bank 172 has a hydrophilic property, and the second bank 174 has a hydrophobic property. A thickness of the second bank 174 can be thicker than a thickness of the first bank 172. That is, the height of the second bank 174 can be greater than the height of the first bank 172.

Meanwhile, the second bank 174 has first and second openings 174a and 174b. The first opening 174a is formed corresponding to each sub-pixel region P and exposes the first electrode 162. The second opening 174b is formed between the same color sub-pixel regions P adjacent to each other, that is, between the green sub-pixels G (e.g., between the sub-pixels G2 and G3 and above the first bank 172 disposed therebetween), connects the first openings 174a corresponding to the same color sub-pixel regions P adjacent to each other, and exposes the first bank 172.

A light-emitting layer 180 is formed on the first electrode 162 exposed through the first opening 174a of the second bank 174 at each sub-pixel region P. Here, a red light-emitting layer 180r is formed at a red sub-pixel R, a green light-emitting layer 180g is formed at a green sub-pixel G, and a blue light-emitting layer 180b is formed at a blue sub-pixel B.

In addition, as shown in FIG. 3, a green light-emitting layer 180g is further formed between the adjacent same color sub-pixel regions P, that is, on the first bank 172 exposed through the second opening 174b of the second bank 174 between the green sub-pixels G, e.g., on the first electrodes 162 in the sub-pixels G3 and G2, and on the first bank 172 between the subpixels G3 and G2. At this time, the green light-emitting layer 180g on the first bank 172 is connected to (or extends to) the green light-emitting layers 180g formed on the first electrodes 162 of the adjacent green sub-pixels G.

The light-emitting layer 180 is formed through a solution process. At this time, since the same color sub-pixels, for example, the green sub-pixels are connected to each other (e.g., G2, G2, G3 and G4 in FIG. 2 are connected to each other in one diagonal direction), the solutions dropped into the green sub-pixels G through different nozzles are connected to each other. Accordingly, a deviation in the dropping amounts between nozzles is minimized, and thicknesses of the light-emitting layers can be uniform in the respective sub-pixels G.

Next, a second electrode 190 is formed on the light-emitting layer 180 and the second bank 174.

The first electrode 162, the light-emitting layer 180 and the second electrode 190 constitute a light-emitting diode De.

Like this, in the electroluminescent display device according to the second embodiment of the present disclosure, the number of red or blue sub-pixels R and B is half the number of green sub-pixels G, and the number of all sub-pixels is reduced. Therefore, the high aperture ratio can be ensured, and the effective resolution can be increased.

Further, the same color sub-pixels R, G or B are arranged to be connected to each other, so that the light-emitting layers 180 of the same color sub-pixels R, G or B are connected to each other to thereby form one body. Thus, a deviation in the dropping amounts between nozzles can be minimized, and the thicknesses of the thin films can be uniform in the respective sub-pixels R, G and B. Accordingly, the mura can be prevented, so that the image quality of the display device can be prevented from being lowered.

Meanwhile, although the (m−3)th column, the (m−2)th column, the (m−1)th column, and the mth column are sequentially arranged from the left side in FIG. 2, the arrangement of the m columns can be varied, and an example of such a variation will be discussed now in reference to FIG. 4.

Figure 4:
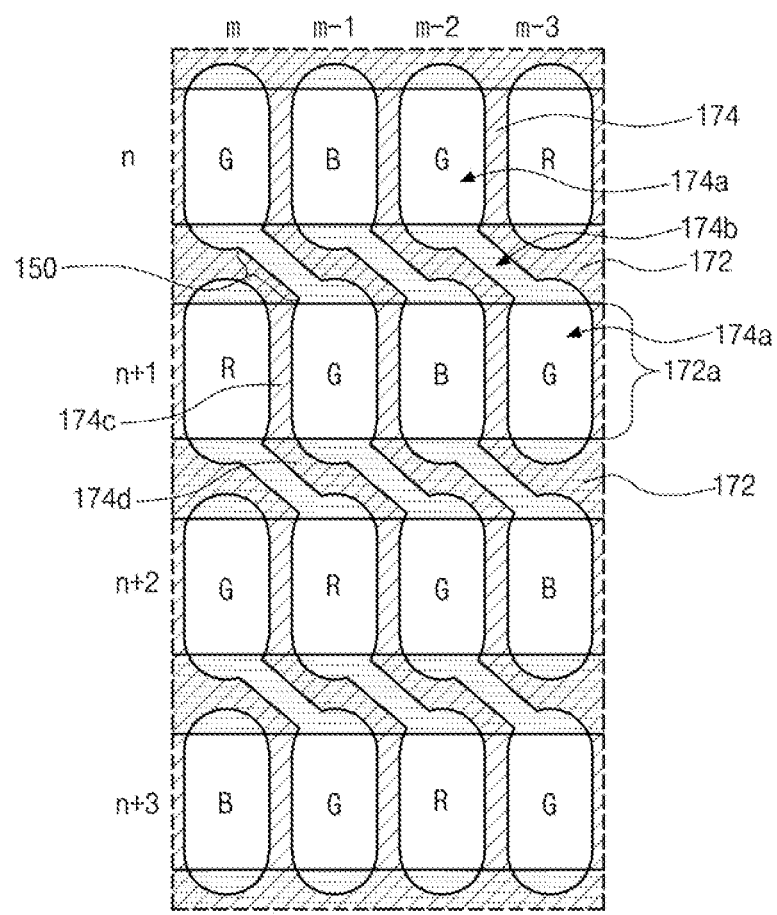
FIG. 4 is a schematic view of a pixel arrangement of another example of an electroluminescent display device according to the second embodiment of the present disclosure.

FIG. 4 is a schematic view of another example of a pixel arrangement of an electroluminescent display device according to the second embodiment of the present disclosure.

The pixel arrangement of FIG. 4 has substantially the same configuration as the pixel arrangement of FIG. 2, except for the difference in the order of the left and right directions. The same parts will be designated by the same references, and descriptions of the same parts will be omitted or will be brief.

In FIG. 4, another example of the electroluminescent display device according to the second embodiment of the present disclosure includes red, green, and blue sub-pixels R, G, and B, and the same color sub-pixels R, G and B are arranged in a diagonal direction and connected to each other.

As shown in FIG. 4, the (m−3)th column, the (m−2)th column, the (m−1)th column, and the mth column are sequentially arranged from the right side to the left side (in comparison to the left to the right side arrangement of FIG. 2), but the number of respective sub-pixels R, G and B and the arrangement order of the same color sub-pixels R, G and B are the same as the number and the arrangement order in FIG. 2. As such, the green subpixels G of FIG. 4 extend along and are connected to each other in a diagonal direction different from the diagonal direction in which the green sub-pixels G1-G4 are connected in FIG. 2. Regardless, all the green sub-pixels G in FIG. 4 still are arranged in a diamond grid as in FIG. 2.

Figure 5:
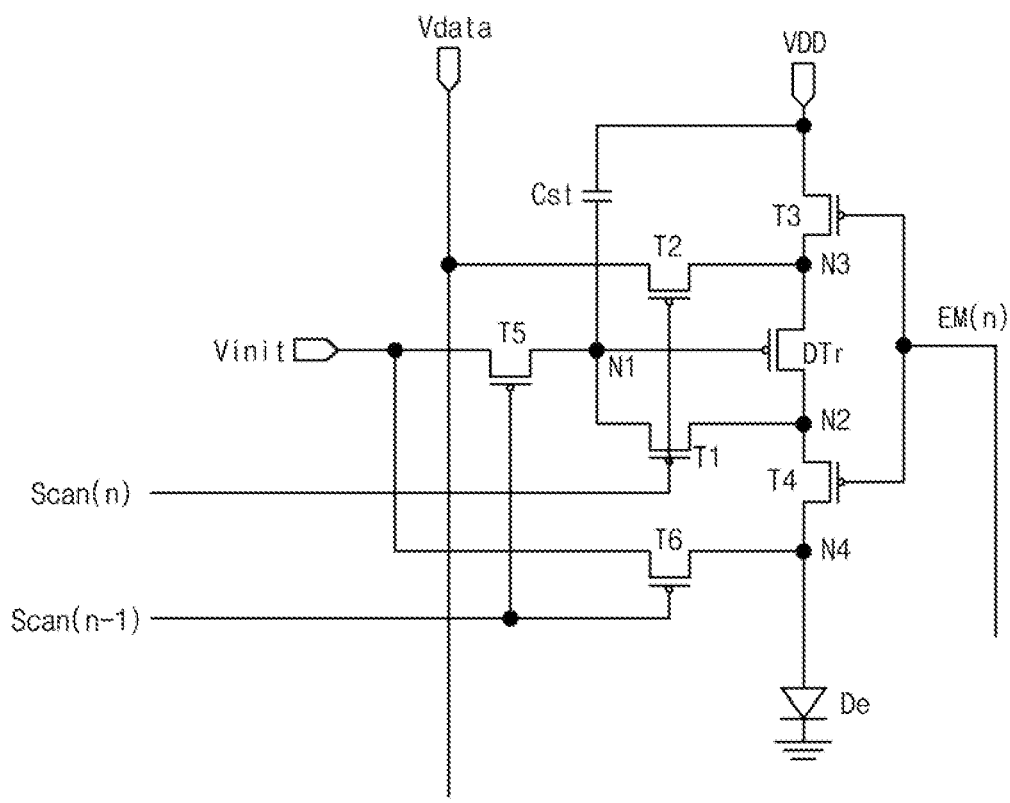
FIG. 5 is an equivalent circuit diagram of one sub-pixel of an electroluminescent display device according to the second embodiment of the present disclosure.

FIG. 5 is an equivalent circuit diagram of one sub-pixel of an electroluminescent display device according to the second embodiment of the present disclosure. Each sub-pixel in the electroluminescent display device of FIGS. 2-4 can have the circuit configuration of FIG. 5.

In FIG. 5, one sub-pixel of an electroluminescent display device according to the second embodiment of the present disclosure includes a driving thin film transistor DTr, first, second, third, fourth, fifth and sixth thin film transistors T1, T2, T3, T4, T5 and T6, a light-emitting diode De, and a storage capacitor Cst.

Here, the first, second, third, fourth, fifth and sixth thin film transistors T1, T2, T3, T4, T5 and T6 and the driving thin film transistor DTr are p-type thin film transistors in which holes are used as carriers for transferring electric charges. However, the present disclosure is not limited thereto, and the first, second, third, fourth, fifth and sixth thin film transistors T1, T2, T3, T4, T5 and T6 and the driving thin film transistor DTr can be n-type thin film transistors in which free electrons are used as carriers for transferring electric charges.

More specifically, a gate of the first thin film transistor T1 is connected to an nth scan line for transferring an nth scan signal Scan(n) (n is a natural number), a source of the first thin film transistor T1 is connected to a first node N1, and a drain of the first thin film transistor T1 is connected to a second node N2. A gate of the second thin film transistor T2 is connected to the nth scan line, a source of the second thin film transistor T2 is connected to a data line for supplying a data voltage Vdata, and a drain of the second thin film transistor T2 is connected to a third node N3. A gate of the third thin film transistor T3 is connected to an emission control line for transferring an emission control signal EM(n), a source of the third thin film transistor T3 is connected to a high voltage supply line for supplying a high voltage VDD, and a drain of the third thin film transistor T3 is connected to the third node N3. A gate of the fourth thin film transistor T4 is connected to the emission control line, a source of the fourth thin film transistor T4 is connected to the second node N2, and a drain of the fourth thin film transistor T4 is connected to a fourth node N4. A gate of the fifth thin film transistor T5 is connected to an (n−1)th scan line for transferring an (n−1)th scan signal Scan(n−1), a source of the fifth thin film transistor T5 is connected to an initialization line for supplying an initialization voltage Vinit, and a drain of the fifth thin film transistor T5 is connected to the first node N1. A gate electrode of the sixth thin film transistor T6 is connected to the (n−1)th scan line, a source of the sixth thin film transistor T6 is connected to the initialization line, and a drain of the sixth thin film transistor T6 is connected to the fourth node N4.

Further, a gate of the driving thin film transistor DTr is connected to the first node N1, a source of the driving thin film transistor DTr is connected to the third node N3, and a drain of the driving thin film transistor DTr is connected to the second node N2.

In the meantime, a first capacitor electrode of the storage capacitor Cst is connected to the first node N1, and a second capacitor electrode is connected to the high voltage supply line. In addition, an anode of the light-emitting diode De is connected to the fourth node N4, and a cathode of the light-emitting diode De is connected to the ground. Alternatively, the cathode of the light-emitting diode De can be connected to a low voltage supply line for supplying a low voltage VSS.

Thus, the gate of the driving thin film transistor DTr, the source of the first thin film transistor T1, the drain of the fifth thin film transistor T5, and the first capacitor electrode of the storage capacitor Cst are connected to the first node N1. The drain of the driving thin film transistor DTr, the drain of the first thin film transistor T1 and the source of the fourth thin film transistor T4 are connected to the second node N2. The source of the driving thin film transistor DTr, the drain of the second thin film transistor T2 and the drain of the third thin film transistor T3 are connected to the third node N3. The drain of the fourth thin film transistor T4, the drain of the sixth thin-film transistor T6, and the anode of the light-emitting diode De are connected to the fourth node N4.

The storage capacitor Cst stores and holds a gate voltage and a threshold voltage Vth of the driving thin film transistor DTr until the next frame.

The driving of the electroluminescent display device of FIG. 5 according to the second embodiment of the present disclosure will be described with reference to FIG. 6.

Figure 6:
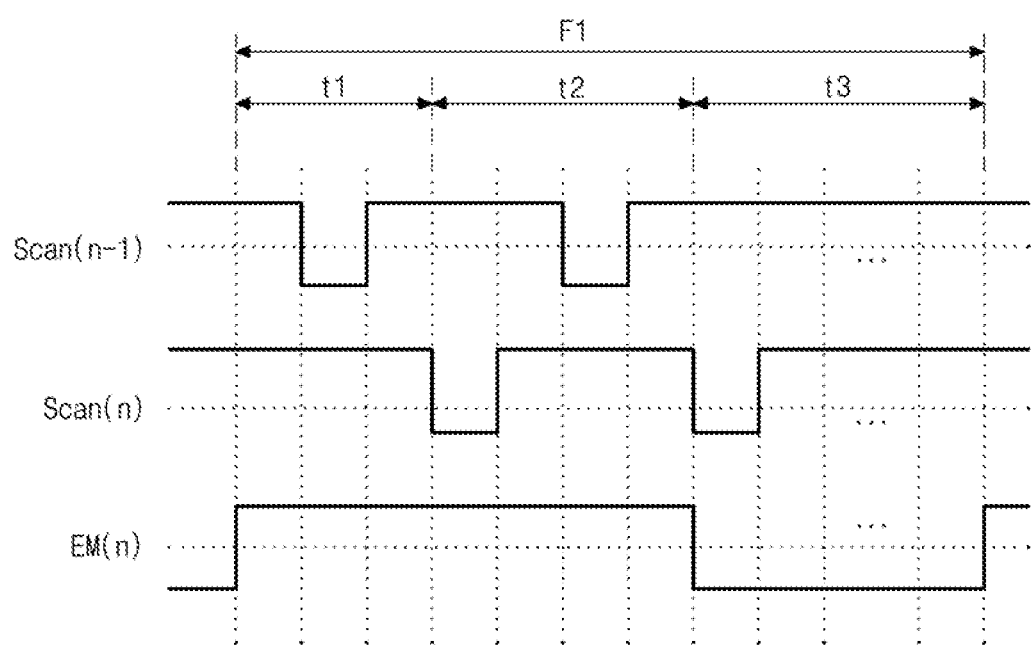
FIG. 6 is a timing diagram schematically illustrating a plurality of signals applied to one sub-pixel of an electroluminescent display device according to the second embodiment of the present disclosure and shows one frame.

FIG. 6 is a timing diagram schematically illustrating a plurality of signals applied to one sub-pixel of an electroluminescent display device according to the second embodiment of the present disclosure and shows one frame.

In FIG. 6, one frame F1 includes first, second and third periods t1, t2 and t3. Here, the first period t1 is a sensing period, the second period t2 is a programming period, and the third period t3 is a light-emitting period. The first period t1 can include an initializing step.

In the first period t1, the nth scan signal Scan(n) and the emission control signal EM(n) have a high level. Thus, the first, second, third and fourth thin film transistors T1, T2, T3 and T4 are turned off.

On the other hand, in the first period t1, the (n−1)th scan signal Scan(n−1) has a high level and then has a low level, and when the (n−1)th scan signal Scan(n−1) has the low level, the fifth and sixth thin film transistors T5 and T6 are turned on. Thus, the initialization voltage Vinit is applied to the first node N1 through the fifth thin film transistor T5 and to the fourth node N4 through the sixth thin film transistor T6, and the first and fourth nodes N1 and N4 have the initializing voltage Vinit. Then, the (n−1)th scan signal Scan(n−1) has a high level again and the fifth and sixth thin film transistors T5 and T6 are turned off.

Next, in the second period t2, the emission control signal EM(n) has the high level and the third and fourth thin film transistors T3 and T4 maintain the turn-off state.

On the other hand, in the second period t2, the (n−1)th scan signal Scan(n−1) has a high level and then has a low level (and then a high level), whereas the nth scan signal Scan(n) has a low level and then has a high level.

More specifically, when the (n−1)th scan signal Scan(n−1) has the high level, both the fifth and sixth thin film transistors T5 and T6 are turned off while the nth scan signal Scan(n) has the low level, so that the first and second thin film transistors T1 and T2 are turned on. Accordingly, the data voltage Vdata is supplied to the third node N3 through the second thin film transistor T2, and the third node N3 has the data voltage Vdata. Further, the initialization voltage Vinit of the first node N1 is discharged through the first thin film transistor T1 until a voltage of the first node N1 is equal to a threshold voltage Vth of the driving thin film transistor DTr, and the first node N1 has the threshold voltage Vth. Then, the nth scan signal Scan(n) has a high level, so that the first and second thin film transistors T1 and T2 are turned off and the threshold voltage Vth of the first node N1 is stored in the storage capacitor Cst.

Next, when the (n−1)th scan signal Scan(n−1) has the low level, both the fifth and sixth thin film transistors T5 and T6 are turned on while the nth scan signal Scan(n) has a high level, so that the first and second thin film transistors T1 and T2 maintain the turn-off state. At this time, the initialization voltage Vinit is applied to the first node N1 through the fifth thin film transistor T5 and to the fourth node N4 through the sixth thin film transistor T6. Accordingly, the first node N1 has the sum of the stored threshold voltage Vth and the applied initialization voltage Vinit, and the fourth node N4 has the initialization voltage Vinit.

Next, in the third period t3, the (n−1)th scan signal Scan(n−1) has a high level, and the fifth and sixth thin film transistors T5 and T6 are turned off.

On the other hand, the nth scan signal Scan(n) has a low level and then has a high level, and the emission control signal EM(n) has a low level. When the nth scan signal Scan(n) has the low level, the second thin film transistor T2 is turned on, the data voltage Vdata is applied to the third node N3. The emission control signal EM(n) has the low level and the third and fourth thin film transistors T3 and T4 are turned on, so that the light-emitting diode De emits light corresponding to the data voltage Vdata.

The sub-pixel structure of the electroluminescent display device according to the second embodiment of the present disclosure will be described in more detail with reference to FIGS. 7 and 8.

Figure 7:
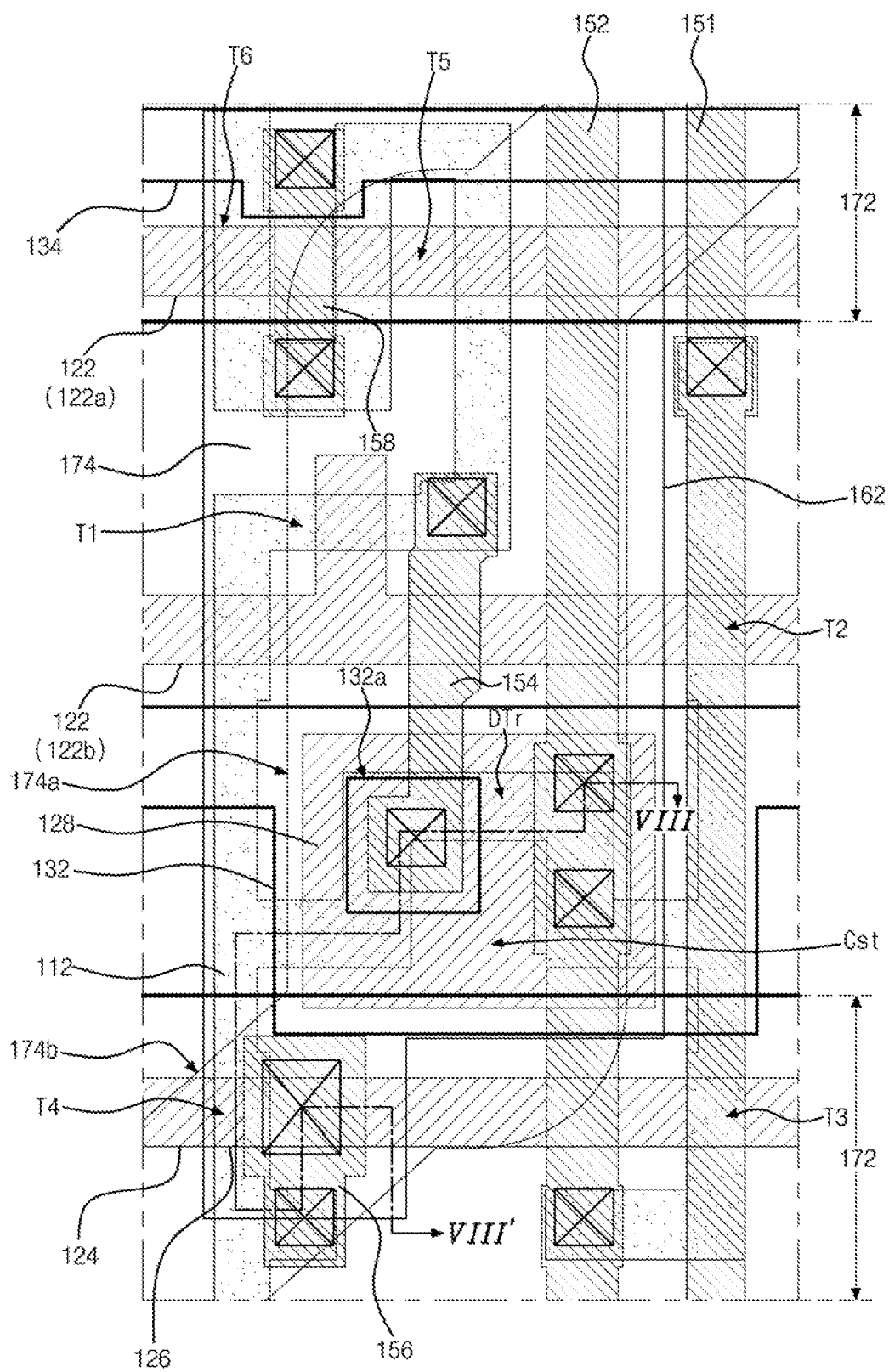
FIG. 7 is a schematic plan view of one sub-pixel of an electroluminescent display device according to the second embodiment of the present disclosure.

FIG. 7 is a schematic plan view of one sub-pixel of an electroluminescent display device according to the second embodiment of the present disclosure.

In FIG. 7, a scan line 122 extending along a first direction (e.g., a row direction) is formed. The scan line 122 includes first and second scan lines 122a and 122b spaced from each other. The first scan line 122a corresponds to the (n−1)th scan line and the second scan line 122b corresponds to the nth scan line. The scan line 122 can be referred to as a gate line. Here, the second scan line 122b can have a protrusion extending along a second direction (e.g., a column direction or a direction perpendicular to the first direction).

In addition, an emission control line 124 and a first capacitor electrode 128 are formed of the same material on the same layer as the scan line 122. The emission control line 124 is located adjacent to the second scan line 122b and extends along the first direction away from the second scan line 122b. The first capacitor electrode 128 is disposed between the second scan line 122b and the emission control line 124.

Then, a second capacitor electrode 132 and an initialization line 134 are formed on a different layer from the scan line 122. The second capacitor electrode 132 and the initialization line 134 can be formed of the same material as the scan line 122.

The second capacitor electrode 132 is disposed between the second scan line 122b and the emission control line 124 and overlaps the first capacitor electrode 128 to form a storage capacitor Cst. The second capacitor electrode 132 has a capacitor hole 132a over the first capacitor electrode 128. The initialization line 134 is located adjacent to the first scan line 122a and extends along the first direction away from the first scan line 122a.

Next, a data line 151 and a high voltage supply line 152 extending along the second direction are formed. The data line 151 and the high voltage supply line 152 are formed on a different layer from the scan line 122, the emission control line 124 and the initialization line 134, and cross the scan line 122, the emission control line 124 and the initialization line 134. The high voltage supply line 152 overlaps the first and second capacitor electrodes 128 and 132 and is electrically connected to the second capacitor electrode 132. The data line 151 can be spaced apart from the first capacitor electrode 128 and overlaps the second capacitor electrode 132.

In addition, first, second and third electrode patterns 154, 156 and 158 are formed of the same material on the same layer as the data line 151 and the high voltage supply line 152. The first electrode pattern 154 overlaps and crosses the second scan line 122b, overlaps the first and second capacitor electrodes 128 and 132, and is electrically connected to the first capacitor electrode 128. The second electrode pattern 156 overlaps and crosses the emission control line 124. The third electrode pattern 158 overlaps and crosses the first scan line 122a and also overlaps the initialization line 134.

Meanwhile, the semiconductor layer 112 is formed on a different layer from the first and second scan lines 122a and 122b, the emission control line 124, the first and second capacitor electrodes 128 and 132, the initialization line 134, the data line 151, the high voltage supply line 152, and the first, second, and third electrode patterns 154, 156, 158. The semiconductor layer 112 can be formed in a pattern in which a plurality of portions are integrally formed as one body and overlap and/or cross the first and second scan lines 122a and 122b, the emission control line 124, the first and second capacitor electrodes 128 and 132, the initialization line 134, the data line 151, the high voltage supply line 152, and the first, second, and third electrode patterns 154, 156, 158. The semiconductor layer 112 functions as an active layer and source and drain regions of each of first, second, third, fourth, fifth and sixth thin film transistors T1, T2, T3, T4, T5 and T6 and a driving thin film transistor DTr and can be doped with impurities corresponding to the source and drain regions.

Here, the first thin film transistor T1 and the second thin film transistor T2 are connected to the second scan line 122b and turned on and off. The third thin film transistor T3 and the fourth thin film transistor T4 are connected to the emission control line 124. The fifth thin film transistor T5 and the sixth thin film transistor T6 are connected to the first scan line 122a and turned on and off. At this time, the first and second scan lines 122a and 122b and a part of the emission control line 124 are gate electrodes of the first, second, third, fourth, fifth and sixth thin film transistors T1, T2, T3, T4, T5 and T6, and the part 126 of the emission control line becomes the gate electrode of the fourth thin film transistor T4.

In addition, the driving thin film transistor DTr is disposed between the second scan line 122b and the emission control line 124. The driving thin film transistor DTr is connected to the first, second, third, fourth and fifth thin film transistors T1, T2, T3, T4 and T5 and the storage capacitor Cst.

Meanwhile, the first electrode 162 is formed substantially in an entire area of the sub-pixel region to cover the first, second, third, fourth, fifth and sixth thin film transistors T1, T2, T3, T4, T5 and T6, the driving thin film transistor DTr, and the storage capacitor Cst. The first electrode 162 is electrically connected to the driving thin film transistor DTr through the fourth thin film transistor T4. In addition, although the first electrode 162 is shown as being spaced apart from the data line 151, it is not limited thereto. That is, the first electrode 162 can partially overlap the data line 151. At this time, the first electrode 162 can overlap one of first and second sides of the data line 151 opposite to each other and can be spaced apart from the other. Alternatively, the first electrode 162 can overlap both the first and second sides of the data line 151.

Next, a first bank 172 is formed along the first direction. The first bank 172 has a hydrophilic property and is disposed between adjacent sub-pixels along the second direction. The first bank 172 covers both edges of the first electrode 162 facing each other along the second direction and exposes a central portion of the first electrode 162.

Further, a second bank 174 having a first opening 174a and a second opening 174b is formed. The second bank 174 has a hydrophobic property and is disposed between adjacent sub-pixels along the first direction and between adjacent sub-pixels along the second direction. The second bank 174 covers both edges of the first electrode 162 facing each other along the first direction. The first opening 174a is formed corresponding to the sub-pixel region and exposes the central portion of the first electrode 162. The second opening 174b is formed corresponding to a region between the adjacent sub-pixel regions along a third direction crossing the first and second directions and exposes the first bank 172.

A light-emitting layer is formed on the first electrode 162 exposed by the first and second banks 172 and 174. In addition, a light-emitting layer is also formed on the first bank 172 exposed through the second opening 174b of the second bank 174.

Next, a second electrode is formed on the light-emitting layer and the second bank 174 over a substantially entire surface of the substrate.

The first electrode 162, the light-emitting layer, and the second electrode constitute a light-emitting diode.

Figure 8:
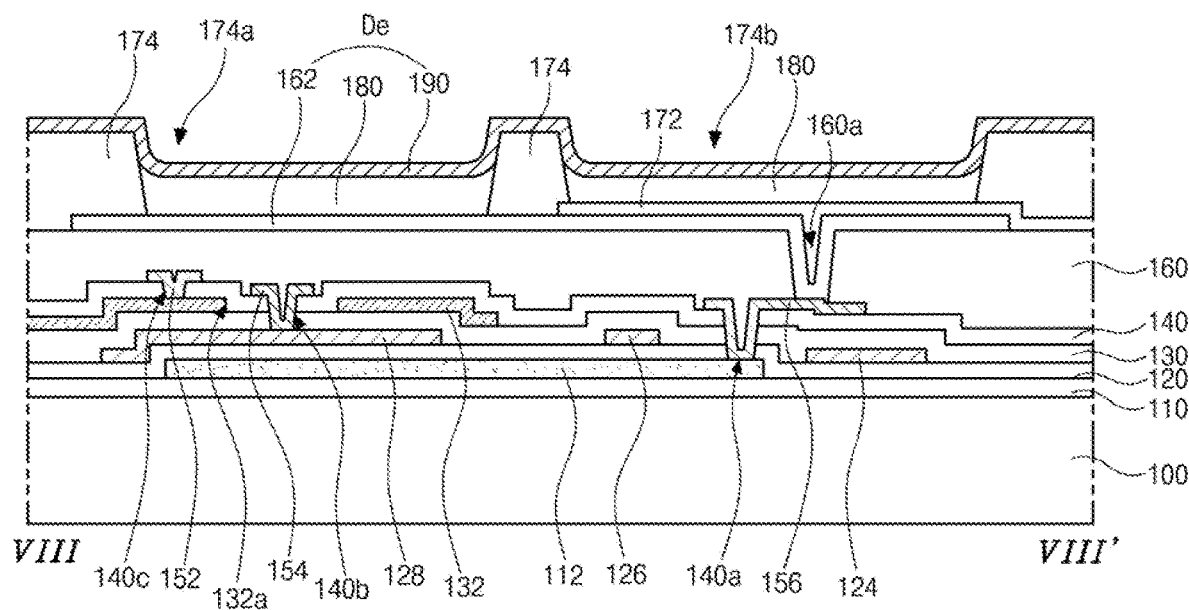
FIG. 8 is a schematic cross-sectional view of one sub-pixel of an electroluminescent display device according to the second embodiment of the present disclosure.

FIG. 8 is a schematic cross-sectional view of one sub-pixel of an electroluminescent display device according to the second embodiment of the present disclosure and shows a cross-section corresponding to the line VIII-VIII' of FIG. 7.

In FIG. 8, a buffer layer 110 is formed substantially on an entire surface of a substrate 100. The substrate 100 can be a glass substrate or a plastic substrate. For example, polyimide can be used as the plastic substrate, but is not limited thereto.

The buffer layer 110 can be formed of an inorganic material such as silicon oxide ($SiO_2$) or silicon nitride (SiNx) and can be a single layer or multiple layers.

A patterned semiconductor layer 112 is formed on the buffer layer 110. The semiconductor layer 112 can be formed of polycrystalline silicon, and the semiconductor layer 112 can be selectively doped with impurities. Alternatively, the semiconductor layer 112 can be formed of an oxide semiconductor material.

A gate insulating layer 120 of an insulating material is formed on the semiconductor layer 112 substantially over the entire surface of the substrate 100. The gate insulating layer 120 can be formed of an inorganic insulating material such as silicon oxide ($SiO_2$) or silicon nitride (SiNx). Meanwhile, when the semiconductor layer 112 is made of an oxide semiconductor material, the gate insulating layer 120 is preferably formed of silicon oxide ($SiO_2$).

A gate electrode 126, an emission control line 124, and a first capacitor electrode 128 are formed on the gate insulating layer 120 and are made of a first conductive material such as metal. Here, the gate electrode 126 is disposed on the semiconductor layer 112 and can be a part of the emission control line 124. In addition, the first capacitor electrode 128 partially overlaps the semiconductor layer 112.

Meanwhile, first and second scan lines 122a and 122b of FIG. 7 are further formed of the first conductive material on the gate insulating layer 120.

In the electroluminescent display device according to the second embodiment of the present disclosure, the gate insulating layer 120 is formed on the entire surface of the substrate 100. However, the gate insulating layer 120 can be patterned to have the same shape as that of the gate electrode 126.

A first insulating layer 130 made of an insulating material is formed on the gate electrode 126, the emission control line 124, and the first capacitor electrode 128 substantially over the entire surface of the substrate 100. The first insulating layer 130 can be formed of an inorganic insulating material such as silicon oxide ($SiO_2$) or silicon nitride (SiNx). Alternatively, the first insulating layer 130 can be formed of an organic insulating material such as photo acryl or benzocyclobutene.

A second capacitor electrode 132 made of a second conductive material such as metal is formed on the first insulating layer 130. The second capacitor electrode 132 overlaps the first capacitor electrode 128 and has a capacitor hole 132a corresponding to the first capacitor electrode 128. The first and second capacitor electrodes 128 and 132 and the first insulating layer 130 therebetween form a storage capacitor Cst.

In addition, an initialization line 134 of FIG. 7 is further formed of the second conductive material on the first insulating layer 130.

A second insulating layer 140 made of an insulating material is formed on the second capacitor electrode 132 substantially over the entire surface of the substrate 100. The second insulating layer 140 can be formed of an inorganic insulating material such as silicon oxide ($SiO_2$) or silicon nitride (SiNx). Alternatively, the second insulating layer 140 can be formed of an organic insulating material such as photo acryl or benzocyclobutene.

The second insulating layer 140 has a plurality of contact holes. At this time, the plurality of contact holes can also be formed in the first insulating layer 130 and/or the gate insulating layer 120 under the second insulating layer 140.

For example, the second insulating layer 140 has a first contact hole 140a exposing a portion of the semiconductor layer 112 together with the first insulating layer 130 and the gate insulating layer 120 and has a second contact hole 140b exposing a portion of the first capacitor electrode 128 together with the first insulating layer 130. In addition, the second insulating layer 140 has a third contact hole 140c exposing a portion of the second capacitor electrode 132 thereunder. Here, the second contact hole 140b is located in the capacitor hole 132a of the second capacitor electrode 132.

Next, a high voltage supply line 152, a first electrode pattern 154 and a second electrode pattern 156 made of a third conductive material such as metal are formed on the second insulating layer 140. The high voltage supply line 152 contacts the second capacitor electrode 132 through the third contact hole 140c, the first electrode pattern 154 contacts the first capacitor electrode 128 through the second contact hole 140b, and the second electrode pattern 156 contacts the semiconductor layer 112 through the first contact hole 140a. Here, the second electrode pattern 156 corresponds to the drain electrode of the fourth thin film transistor T4 of FIG. 7.

In addition, a data line 151 of FIG. 7 and a third electrode pattern 158 made of the third conductive material are further formed on the second insulating layer 140.

Then, an overcoat layer 160 made of an insulating material is formed as a third insulating layer on the high voltage supply line 152, the first electrode pattern 154, and the second electrode pattern 156 substantially over the entire surface of the substrate 100. The overcoat layer 160 can alleviate the stepped portions due to the underlying layers and have a flat top surface. The overcoat layer 160 can be formed of an organic insulating material such as photo acryl or benzocyclobutene.

The overcoat layer 160 has a drain contact hole 160a exposing a portion of the second electrode pattern 156. The drain contact hole 160a can be spaced apart from the first contact hole 140a. However, the present disclosure is not limited thereto, and the drain contact hole 160a can overlap the first contact hole 140a.

Next, a first electrode 162 is formed on the overcoat layer 160 and formed of a conductive material having a relatively high work function. The first electrode 162 is in contact with the second electrode pattern 156 through the drain contact hole 160a. For example, the first electrode 162 can be formed of a transparent conductive material such as indium tin oxide (ITO) or indium zinc oxide (IZO), but is not limited thereto.

Meanwhile, the electroluminescent display device according to the second embodiment of the present disclosure is a top emission type in which light of a light-emitting diode is output toward a direction opposite to the substrate 100. Accordingly, the first electrode 162 can further include a reflective electrode or a reflective layer formed of a metal material having a relatively high reflectance below the transparent conductive material. For example, the reflective electrode or reflective layer can be formed of an aluminum-palladium-copper (APC) alloy or silver (Ag). At this time, the first electrode 162 can have a triple-layer structure of ITO/APC/ITO or ITO/Ag/ITO, but is not limited thereto.

A first bank 172 is formed of an insulating material on the first electrode 162. The first bank 172 has a hydrophilic property and covers at least one edge of the first electrode 162. The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

A second bank 174 is formed on the first bank 172 and on the first electrode 162. The second bank 174 has a hydrophobic property and covers at least one edge of the first electrode 162. In addition, the second bank 174 overlaps the first bank 172 and can cover at least one edge of the first bank 172. The second bank 174 can be formed of an organic insulating material having a hydrophobic property.

The second bank 174 has a plurality of first and second openings 174a and 174b. The first opening 174a exposes the first electrode 162 and the second opening 174b exposes the first bank 172.

Further, a light-emitting layer 180 is formed on the first electrode 162 and the first bank 172 exposed through the first and second openings 174a and 174b.

The light-emitting layer 180 can include a first charge auxiliary layer, a light-emitting material layer, and a second charge auxiliary layer sequentially positioned over the first electrode 162 and the first bank 172. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto, and other variations are possible.

Furthermore, the light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto and other variations are possible.

In the meantime, the electron auxiliary layer of the light-emitting layer 180 can be formed through an evaporation process. At this time, the electron auxiliary layer can be formed substantially over the entire surface of the substrate 100.

A second electrode 190 of a conductive material having a relatively low work function is formed on the light-emitting layer 180 substantially over the entire surface of the substrate 100. Here, the second electrode 190 can be formed of aluminum (Al), magnesium (Mg), silver (Ag), or an alloy thereof. At this time, the second electrode 190 has a relatively thin thickness so that light from the light-emitting layer 180 can be transmitted therethrough. Alternatively, the second electrode 190 can be formed of a transparent conductive material such as indium-gallium-oxide (IGO), but is not limited thereto.

The first electrode 162, the light-emitting layer 180 and the second electrode 190 constitute a light-emitting diode De of each sub-pixel. Here, the first electrode 162 can serve as an anode, and the second electrode 190 can serve as a cathode, but the present disclosure is not limited thereto and other variations are possible.

As described above, the electroluminescent display device according to the various examples of the second embodiment of the present disclosure can be a top emission type in which light from the light-emitting layer 180 of the light-emitting diode De is output toward a direction opposite to the substrate 200, that is, output to the outside through the second electrode 190. The top emission type display device can have a wider emission area than a bottom emission type display device of the same size, so that the brightness can be improved and the power consumption can be reduced.

At this time, the light-emitting diode De of each sub-pixel can have an element thickness for a micro-cavity effect corresponding to a wavelength of the emitted light, thereby increasing the light efficiency. That is, the light-emitting diodes De of the red, green and blue sub-pixels can have different element thicknesses. Here, the element thickness can be defined as a distance between the first electrode 162 and the second electrode 190.

Meanwhile, a protective layer and/or an encapsulating layer can be formed on the second electrode 190 substantially over the entire surface of the substrate 100 to block moisture or oxygen introduced from the outside, thereby protecting the light-emitting diode De.

Third Embodiment

Figure 9:
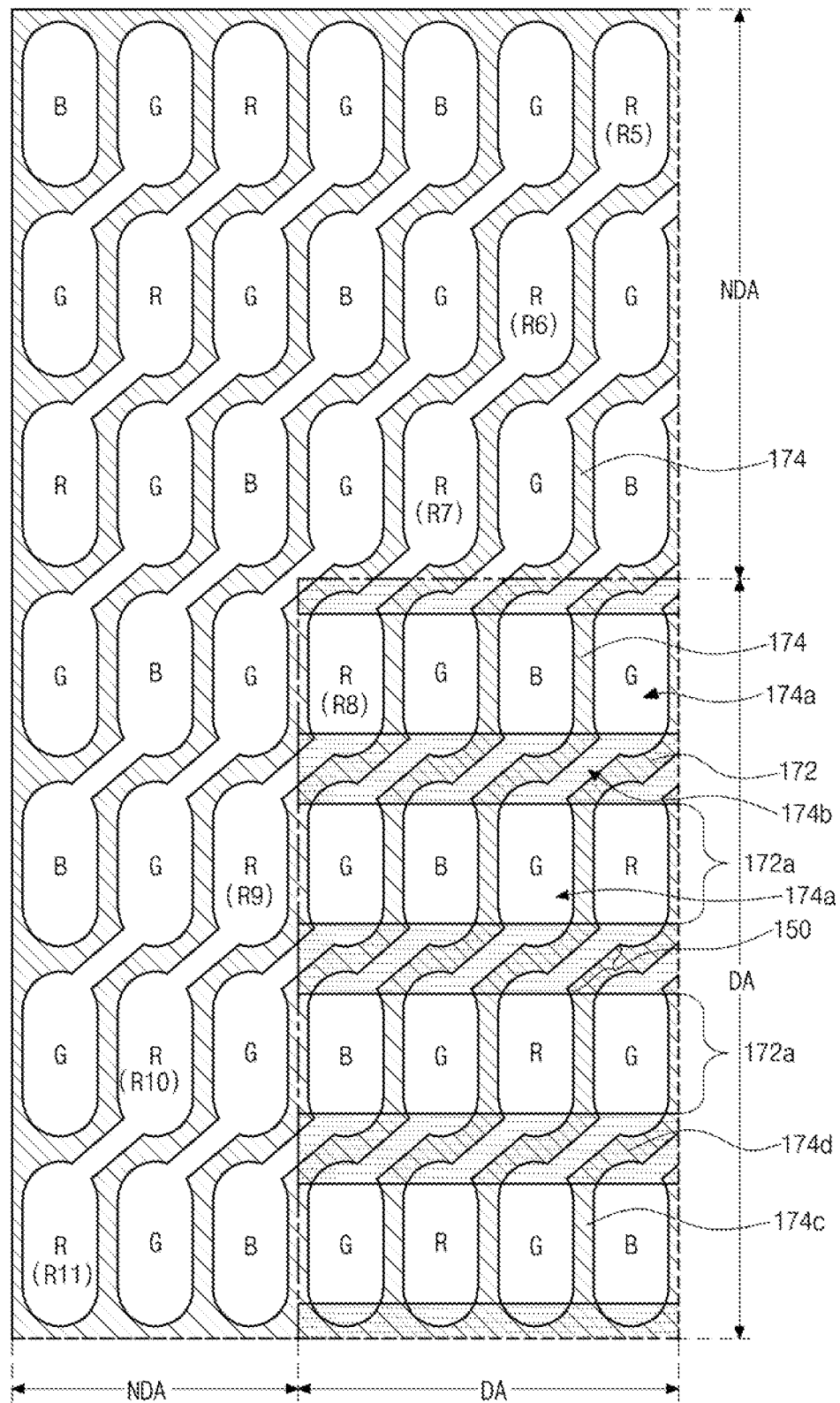
FIG. 9 is a schematic view of an electroluminescent display device according to a third embodiment of the present disclosure.

FIG. 9 is a schematic view of an electroluminescent display device according to a third embodiment of the present disclosure.

The electroluminescent display device according to the third embodiment of the present disclosure further includes a configuration of a non-display area as compared with the electroluminescent display device according to the second embodiment and has the same configuration of a display area as that of the second embodiment. The same parts will be designated by the same references, and descriptions of the same parts will be omitted or shortened.

As shown in FIG. 9, in the electroluminescent display device according to the third embodiment of the present disclosure, a display area DA displaying an image and a non-display area NDA surrounding at least one or more sides of the display area DA are defined on the substrate. The display area DA can have the same pixel arrangement as those of FIGS. 2-8, and can be surrounded completely by the non-display areas NDA. In the display area DA, red, green and blue sub-pixels R, G and B are arranged in a matrix form, and the same color sub-pixels R, G and B are arranged in a diagonal direction and connected to each other.

More specifically, the red, green and blue sub-pixels R, G and B include red, green and blue light-emitting layers, respectively, and the sub-pixels R, G and B of the display area DA are connected to the sub-pixels R, G and B of the non-display area NDA having the same colors, respectively. Accordingly, the sub-pixel R in the first row and the first column of the display area DA is connected to one sub-pixel R or more of the non-display area NDA in a diagonal direction. For example, as shown in FIG. 9, the sub-pixel R in the first row and the first column of the display area DA is connected to six sub-pixels R of the non-display area NDA (e.g., subpixels R5-R11 are connected to each other in a diagonal direction), but is not limited thereto and other variations are possible.

Here, the red, green and blue sub-pixels R, G and B disposed in the non-display area NDA are dummy sub-pixels in which a thin film transistor and a storage capacitor are not formed. However, the sub-pixels R, G and B of the non-display area NDA are not limited to those as illustrated.

Further, in the non-display area NDA, only the second bank 174 can be formed by omitting the first bank 172. In this case, when the light-emitting layer is formed, the solution can be confined more in the sub-pixels R, G and B of the non-display area NDA than the sub-pixels R, G and B of the display area DA. Accordingly, the drying speed of the solvent can be made uniform at the central portion and at the edge portion, thereby obtaining the light-emitting layer having a more uniform thickness.

Meanwhile, the first electrode (e.g., 162) can be omitted in the red, green and blue sub-pixels R, G and B of the non-display area NDA.

As described above, in the third embodiment of the present disclosure, the sub-pixels R, G and B of the display area DA are respectively connected to the sub-pixels R, G and B of the non-display area NDA. Thus, a deviation between nozzles can be minimized with respect to all sub-pixels R, G and B of the display area DA, thereby forming thin films having a uniform thickness in the respective sub-pixels R, G and B.

In the present disclosure, by forming the light-emitting layer of each sub-pixel through the solution process, a mask is omitted to thereby reduce the manufacturing costs, and a display device with a large size and high definition can be implemented.

In addition, as part of the advantages offered by the present disclosure, the number of red sub-pixels and the number of blue sub-pixels can be half the number of green sub-pixels and the number of all sub-pixels is reduced, so that the high aperture ratio can be ensured and the effective resolution can be increased.

Moreover, the same color sub-pixels are connected to each other, and the light-emitting layers of the same color sub-pixels are formed as one body, thereby minimizing the deviation in the dropping amount between nozzles and uniformly forming the thicknesses of the light-emitting layers of the sub-pixels. Therefore, the mura is prevented, thereby effectively preventing the image quality of the display device from being lowered.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
a plurality of pixel arrangements disposed on a substrate and configured to display images,
wherein each pixel arrangement includes a plurality of sub-pixels arranged in a 4×4 matrix configuration on the substrate, and the plurality of pixel arrangements are repeatedly disposed adjacent to each other along a first direction and a second direction substantially perpendicular to the first direction; and
a light-emitting diode disposed in each of the plurality of sub-pixels and including a first electrode, a light-emitting layer and a second electrode,
wherein among the plurality of sub-pixels, the sub-pixel of an nth row and an mth column has a same color as the sub-pixel of an (n+1)th row and an (m−1)th column, where n is a natural number and m is a natural number larger than 4,
wherein among the plurality of sub-pixels, the sub-pixel of the nth row and a kth column has a same color being green as the sub-pixel of the nth row and a (k−2)th column, where k is a natural number smaller than or equal to m,
wherein in the 4×4 matrix configuration of each pixel arrangement, four same-color sub-pixels having a first color being green extend to be connected to each other in one diagonal direction between the first and second directions, three same-color sub-pixels having a second color extend to be connected to each other in the one diagonal direction, and three same-color sub-pixels having a third color extend to be connected to each other in the one diagonal direction, and
wherein the first, second and third colors are different from each other.

2. The electroluminescent display device of claim 1, wherein the sub-pixel of the nth row and the kth column, the sub-pixel of the nth row and a (k−1)th column, and the sub-pixel of the nth row and a (k−3)th column have different colors from each other.

3. The electroluminescent display device of claim 2, wherein one of the sub-pixel of the nth row and the (k−1)th column and the sub-pixel of the nth row and the (k−3)th column is a red sub-pixel, and the other of the sub-pixel of the nth row and the (k−1)th column and the sub-pixel of the nth row and the (k−3)th column is a blue sub-pixel.

4. The electroluminescent display device of claim 1, wherein in the 4×4 matrix configuration of each pixel arrangement, the light-emitting layer in the sub-pixel at a first row and a first column integrally extends to and is directly connected to the light-emitting layer in the sub-pixel at a second row and a second column, and
wherein the electroluminescent display device further comprises:
a first bank extending in strips along the first direction, and covering edges of the first electrodes; and
a second bank disposed on the substrate and separating the sub-pixels from each other in each row.

5. The electroluminescent display device of claim 4, wherein the first bank has a hydrophilic property, and the second bank has a hydrophobic property.

6. The electroluminescent display device of claim 4, wherein the first bank extends along the first direction and disposed between adjacent sub-pixels extending along the second direction, and
wherein the second bank has a first opening and a second opening, the first opening corresponding to each of the plurality of sub-pixels and the second opening corresponding to an area between the sub-pixel of the nth row and the mth column and the sub-pixel of the (n+1)th row and the (m−1)th column.

7. The electroluminescent display device of claim 6, wherein the second opening connects the first opening corresponding to the sub-pixel of the nth row and the mth column, with the first opening corresponding to the sub-pixel of the (n+1)th row and the (m−1)th column.

8. The electroluminescent display device of claim 6, wherein the first opening exposes the first electrode and the second opening exposes the first bank.

9. The electroluminescent display device of claim 8, wherein the light-emitting layer is disposed on the exposed first electrode and the exposed first bank.

10. The electroluminescent display device of claim 1, wherein the sub-pixel of the nth row and the mth column has a same color as the sub-pixel of an (n+4)th row and the mth column.

11. The electroluminescent display device of claim 1, further comprising:
a first bank extending in strips along the first direction, and covering edges of the sub pixels; and
a second bank disposed on the substrate and separating the sub-pixels from each other in each row and column, wherein the second bank has two different types of openings, and
one of the openings of the second bank extends in the one diagonal direction between the same color sub-pixels that are connected to each other in the one diagonal direction.

12. The electroluminescent display device of claim 1, wherein each of the plurality of sub-pixels includes first, second, third, fourth, fifth and sixth thin film transistors, a driving thin film transistor, and a storage capacitor,
wherein a gate of the driving thin film transistor, a source of the first thin film transistor, a drain of the fifth thin film transistor and a first capacitor electrode of the storage capacitor are connected to a first node,
wherein a drain of the driving thin film transistor, a drain of the first thin film transistor and a source of the fourth thin film transistor are connected to a second node,
wherein a source of the driving thin film transistor, a drain of the second thin film transistor and a drain of the third thin film transistor are connected to a third node, and
wherein a drain of the fourth thin film transistor, a drain of the sixth thin film transistor, and the first electrode of the light-emitting diode are connected to a fourth node.

13. The electroluminescent display device of claim 12, wherein a gate of the first thin film transistor and a gate of the second thin film transistor are connected to an nth scan line,
a gate of the third thin film transistor and a gate of the fourth thin film transistor are connected to an emission control line, and
a gate of the fifth thin film transistor and a gate of the sixth thin film transistor are connected to an (n−1)th scan line.

14. The electroluminescent display device of claim 13, wherein a source of the second thin film transistor is connected to a data line,
a source of the third thin film transistor and a second capacitor electrode of the storage capacitor are connected to a high voltage supply line, and
a source of the fifth thin film transistor and a source of the sixth thin film transistor are connected to an initialization line.

15. An electroluminescent display device comprising:
a plurality of pixel arrangements disposed on a substrate and configured to display images,
each pixel arrangement including a plurality of sub-pixels arranged in a 4×4 matrix configuration on the substrate, the 4×4 matrix configuration including a first row, a second row, a third row and a fourth row extending in a first direction and a first column, a second column, a third column and a fourth column extending in a second direction substantially perpendicular to the first direction,
wherein in the 4×4 matrix configuration of each pixel arrangement, the sub-pixel at the first row and the fourth column, the sub-pixel at the second row and the third column, the sub-pixel at the third row and the second column, and the sub-pixel at the fourth row and the first column have a same first color being green, and extend to be connected to each other in one diagonal direction between the first and second directions,
wherein in the 4×4 matrix configuration of each pixel arrangement, the sub-pixel at the first row and the third column, the sub-pixel at the second row and the second column, and the sub-pixel at the third row and the first column have a same second color being different from the first color, and extend to be connected to each other in the one diagonal direction,
wherein for each row, the sub-pixels at the first and third columns or at the second and fourth columns have the same first color being green, and
wherein for each column, the sub-pixels at the first and third rows or at the second and fourth rows have the same first color being green.

16. The electroluminescent display device of claim 15, wherein in the 4×4 matrix configuration of each pixel arrangement, the sub-pixel at the second row and the fourth column, the sub-pixel at the third row and the third column, and the sub-pixel at the fourth row and the second column have a same third color being different from the first and second colors, and extend to be connected to each other in the one diagonal direction, and
wherein the second color is one of red and blue, and the third color is the other one of the red and blue.

17. The electroluminescent display device of claim 15, wherein a light-emitting diode is disposed in each sub-pixel and includes a first electrode, a light-emitting layer and a second electrode, and
wherein the light-emitting layer in the sub-pixel at the first row and the fourth column integrally extends to and is directly connected to the light-emitting layer in the sub-pixel at the second row and the third column.

18. The electroluminescent display device of claim 10, wherein the light-emitting layer in the sub-pixel at the second row and the third column integrally extends to and is directly connected to the light-emitting layer in the sub-pixel at the third row and the second column, and
wherein the light-emitting layer in the sub-pixel at the third row and the second column integrally extends to and is directly connected to the light-emitting layer in the sub-pixel at the fourth row and the first column.

19. The electroluminescent display device of claim 17, wherein each pixel arrangement further includes:
a first bank extending in strips along the first direction, and covering edges of the first electrodes, and
a second bank disposed on the substrate and separating the sub-pixels from each other in each row.

20. The electroluminescent display device of claim 15, wherein among the plurality of pixel arrangements, one pixel arrangement is directly adjacent to another pixel arrangement in the first direction, and one pixel arrangement is directly adjacent to another pixel arrangement in the second direction.

21. The electroluminescent display device of claim 15, further comprising:

a first bank extending in strips along the first direction, and covering edges of the sub pixels; and a second bank disposed on the substrate and separating the sub-pixels from each other in each row and column, wherein the second bank has two different types of openings, and one of the openings of the second bank extends in the one diagonal direction between the same color sub-pixels that are connected to each other in the one diagonal direction.

22. An electroluminescent display device comprising:

a plurality of pixel arrangements disposed on a substrate and configured to display images, each pixel arrangement including a plurality of sub-pixels arranged in a 4×4 matrix configuration on the substrate, the 4×4 matrix configuration including a first row, a second row, a third row and a fourth row extending in a first direction and a first column, a second column, a third column and a fourth column extending in a second direction, wherein the sub-pixel at the first row and the fourth column, the sub-pixel at the second row and the third column, the sub-pixel at the third row and the second column, and the sub-pixel at the fourth row and the first column have a same predetermined color and extend in a diagonal direction between the first and second directions, wherein same color sub-pixels of the diagonal direction are arranged to be connected to each other, so that light-emitting layers of the same color sub-pixels of the diagonal direction are connected to each other to thereby form one body, wherein for each row, the sub-pixels at the first and third columns or at the second and fourth columns have the same predetermined color, wherein for each column, the sub-pixels at the first and third rows or at the second and fourth rows have the same predetermined color, wherein a light-emitting diode is disposed in each sub-pixel and includes a first electrode, the light-emitting layer and a second electrode, and wherein each pixel arrangement further includes:
a first bank extending in strips along the first direction, and covering edges of the first electrodes, and
a second bank disposed on the substrate and separating the sub-pixels from each other in each row.

* * * * *